(12) United States Patent
Risbo et al.

(10) Patent No.: US 7,425,874 B2
(45) Date of Patent: Sep. 16, 2008

(54) ALL-DIGITAL PHASE-LOCKED LOOP FOR A DIGITAL PULSE-WIDTH MODULATOR

(75) Inventors: Lars Risbo, Kobernhavn Ø (DK); Asit Shankar, Richardson, TX (US); Josey George Angilivelil, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 83 days.

(21) Appl. No.: 11/427,853

(22) Filed: Jun. 30, 2006

(65) Prior Publication Data

US 2008/0012647 A1    Jan. 17, 2008

(51) Int. Cl.
*H03L 7/093* (2006.01)

(52) U.S. Cl. .......................... 331/1 A; 331/17; 375/376

(58) Field of Classification Search ............ 331/17, 331/18, 25, 34, 57, 1 A, 175; 327/156, 157; 375/373, 375, 376, 237, 242, 254
See application file for complete search history.

(56) References Cited

U.S. PATENT DOCUMENTS

| | | | | |
|---|---|---|---|---|
| 5,459,766 | A * | 10/1995 | Huizer et al. | 375/376 |
| 6,069,505 | A * | 5/2000 | Babanezhad | 327/156 |
| 7,282,999 | B2 * | 10/2007 | Da Dalt et al. | 331/1 A |
| 2002/0135419 | A1 * | 9/2002 | Groves et al. | 330/10 |
| 2003/0141936 | A1 * | 7/2003 | Staszewski et al. | 331/16 |
| 2004/0155714 | A1 * | 8/2004 | Nishikawa et al. | 331/57 |

OTHER PUBLICATIONS

Dunning et al., "An All-Digitial Phase-Locked Loop with 50-Cycle Lock Time Suitable for High-Performance Microprocessors", Apr. 1995, IEEE Journal of Solid-State Circuits, vol. 30, No. 4, pp. 412-422.*

Dai et al., Design of High-Performance CMOS Voltage-Controlled Oscillators (Klewer Academic, 2002), pp. 88-106.

Olsson et al., "An all-Digital PLL Clock Multiplier", 2002 IEEE Asia-Pacific Conference on ASIC Proceedings, Paper 5B-3.

Best, Phase-Locked Loops, 3d ed. (McGraw-Hill), 1997), pp. 177-199.

Barrett, "Fractional/integer-N PLL Bascis", Technical Brief SWRA029 (Texas Instruments, Aug. 1999).

Gilbert, "The Multi-Tanh Principle: A Tutorial Overview", J. Solid State Circ., vol. 33, No. 1 (IEEE, Jan. 1998), pp. 2-17.

* cited by examiner

*Primary Examiner*—Robert J. Pascal
*Assistant Examiner*—Ryan J. Johnson
(74) *Attorney, Agent, or Firm*—Warren L. Franz; Wade J. Brady, III; Frederick J. Telecky, Jr.

(57) ABSTRACT

A digital audio system including a digital phase-locked-loop circuit for generating a pulse-width-modulation (PWM) clock signal, applied to a pulse-code-modulation to pulse-width-modulation converter, is disclosed. The digital phase-locked loop includes a phase detector for measuring phase error between a reference signal and a feedback signal. A digital version of the phase error, after filtering by a loop filter, is converted to a digital delay control word that is sampled at twice its frequency. Successive samples of the delay control word control the propagation delay of first and second delay cells in an oscillator. The use of successive samples at substantially twice the frequency of change of the delay control word effectively realizes the sum of a sinc filter and a comb filter, which greatly suppresses the effects of jitter in the reference signal to the digital phase-locked loop.

22 Claims, 6 Drawing Sheets

ALL-DIGITAL PHASE-LOCKED LOOP FOR A DIGITAL PULSE-WIDTH MODULATOR

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of phase-locked loop circuits, and is more specifically directed to such circuits as used in digital audio systems involving class D output amplification driven by pulse-width-modulated drive signals.

In recent years, digital signal processing techniques have become prevalent in many electronic systems. Tremendous increases in the switching speed of digital circuits have enabled digital signal processing to replace, in large part, analog circuits in many applications. For example, the sampling rates of modern digital signal processing are sufficiently fast that digital techniques have become widely implemented in audio electronic applications.

Digital techniques for audio signal processing now extend to the driving of the audio output amplifiers. A new class of amplifier circuits has now become popular in many audio applications, namely "class D" amplifiers. Class D amplifiers drive a complementary output signal that is digital in nature, with the output voltage swinging fully from "rail-to-rail" at a duty cycle that varies with the audio information. Complementary metal-oxide-semiconductor (CMOS) output drive transistors are thus suitable for class D amplifiers, as such devices are capable of full-rail switching at high frequencies, as desired for digital applications. As known in the art, CMOS drivers are close to ideal switches having very low on-resistance, and their resulting efficiency is especially beneficial in portable and automotive audio applications, as well as in small form factor systems such as flat-panel LCD and plasma televisions, and DVD receivers. The ability to realize the audio output amplifier in CMOS has also enabled integration of an audio output amplifier with other circuitry in the audio system, further improving efficiency and also reducing manufacturing cost of the system. This integration also provides performance benefits resulting from close device matching between the output devices and the upstream circuits, and from reduced signal attenuation.

As is fundamental in the art, several types of audio signals are amplitude-modulated signals, in which a sinusoidal signal (the "carrier") at a relatively high frequency is amplitude-modulated with the audio information. Conventional tuners include an analog demodulator that mixes the input signal with an unmodulated sinusoid at the carrier frequency in one or more stages, to resolve a difference signal corresponding to the modulated audio information, but at baseband (i.e., audio) frequencies. These conventional tuners then convert the baseband modulation signal to a digital data stream by way of conventional analog-to-digital conversion, at a fixed sample frequency (e.g., 44.1 kHz, or 48 kHz) that is above the Nyquist criterion for the desired audio frequencies. In conventional class D audio systems, the sampled baseband modulation signal is then pulse-width-modulated to produce drive signals for the system speakers.

FIG. 1 illustrates an example of a conventional pulse-width-modulated digital amplifier system. In this system, a digital audio signal, for example a sixteen to thirty-two bit digital datastream AUD_IN, is received by digital audio processing function 3, which performs such conventional functions as parametric speaker equalization or "voicing", implementation of graphic equalizer presets, treble and bass adjustment, precision soft volume control, loudness compensation, dynamic range compression, background noise floor compensation or noise squelch, center or sub-woofer channel synthesis, programmable dither, peak limiting and clipping, and other digital filter processing. These functions are typically performed by the application of biquad, or second-order IIR, digital filters in a cascade arrangement, as well known in the art. Following such digital audio processing, interpolation function 5 generates an oversampled version of the digital audio signal. Noise shaper and pre-correction filter function 7 then applies conventional digital filter functions to the oversampled signal; as known in the art, noise shaping effectively shifts noise energy away from frequencies of interest (i.e., frequencies that will appear in the audio band), and into portions of the bandwidth that have no effect on the output audio signal. The output of functions 3, 5, 7 is pulse-code-modulated (PCM) signal PCM_SIG that is applied to PCM to PWM conversion function 9, which in turn converts PCM signal PCM_SIG into pulse-width-modulated (PWM) output signal PWM_SIG. Signal PWM_SIG drives power stage 8, which in this example is a conventional class D power amplifier. which drives speaker SPKR. Class D power stage 8, in this example, drives speaker SPKR, via its apparent LC filter 11, in either full-bridge or half-bridge fashion, depending on the system design.

For purposes of this description, the frequency of signal PCM_SIG as output by function 7 is based on sampling frequency $f_s$, which is the frequency of the incoming digital audio signal AUD_IN (or a sampling frequency to which signal AUD_IN is converted by sample rate conversion, such as in a system that can receive various audio input sources). Signal PCM_SIG thus has a frequency at a multiple of sampling frequency $f_s$, with the multiple determined by the oversampling rate of interpolation function 5. For example, a typical sampling frequency $f_s$ for digital audio is 48 kHz, and a typical oversampling multiple is eight, resulting in a frequency of $8f_s$=384 kHz for the signal PCM_SIG as applied to PCM to PWM conversion function 9. Signal PCM_SIG is typically a multiple-bit signal (e.g., eight bits) for each audio channel (one of which is illustrated in FIG. 1).

PCM to PWM conversion function 9, as mentioned above, converts the PCM signal PCM_SIG to a PWM signal PWM_SIG. The frequency of signal PWM_SIG is based upon a clock signal PWM_CLK, which in this example is generated by phase-locked loop (PLL) 6. PLL 6 is a conventional analog phase-locked loop, which generates its output clock signal PWM_CLK at a phase and frequency relationship relative to a clock signal at its input. This clock PWM_CLK is a very high frequency clock, as its period defines the pulse width of the smallest PWM pulse generated by PCM to PWM function. For example, if signal PCM_SIG is an eight-bit signal at a frequency of $8f_s$ that that is to be converted into a double-sided symmetrical PWM duty cycle value, the frequency of PWM clock PWM_CLK ought to be 512 times $8f_s$; for a sampling frequency $f_s$ of 48 kHz, therefore, the frequency of clock PWM_CLK would be about 196 MHz. While "single-sided" PWM would require a PWM clock of only 256 times $8f_s$, a doubled clock frequency is preferable, to maintain symmetry of the PWM signal, as known in the art. In this conventional system of FIG. 1, the reference clock signal is based on master clock signal MSTR_CLK, which is received from external to the digital audio system and which is applied to PLL 6, after the appropriate frequency division by frequency divider 4 to the extent desired by the designer.

A typical power spectral density (PSD) spectrum for the output PWM signal PWM_SIG is illustrated in FIG. 2. Spike 12 indicates the output audio signal carried by the PWM output signal, for example at about 20 kHz and thus within the audio band. Spike 14 represents the power at the switching frequency $8f_s=384$ kHz, in this example, with carrier sidebands 16 disposed on either side of this fundamental. As evident from FIG. 2, the signal power of signal PWM_SIG is concentrated at harmonics of the switching carrier, with spikes at odd-numbered harmonics of the switching frequency $8f_s=384$ kHz (e.g., spike 19 at the third harmonic, at 1152 kHz), but with spikes from the carrier sidebands centered also around even harmonics of the switching carrier. FIG. 2 also illustrates the effects of noise shaping function 7, which moves or concentrates noise energy at frequencies between the fundamental and harmonics of the switching frequency $8f_s=384$ kHz. This noise shaping helps to reduce the noise energy at those frequencies at which the PWM output signal provides significant energy.

As mentioned above, the frequency of signal PWM_SIG is generated by PLL 6, based on a reference clock signal that is, in turn, based on an external master clock signal MSTR_CLK. This master clock signal MSTR_CLK is typically slaved to the input signal source, and based on an external crystal reference. It has been discovered, in connection with this invention, that the frequency of this master clock signal MSTR_CLK is therefore generally not sufficiently stable for high-fidelity digital audio systems. Indeed, it has been discovered, in connection with this invention, that the actual noise in the audio band is generally dominated by phase jitter in the PWM clock signal PWM_CLK, which is of course directly dependent on the phase jitter in the master clock signal MSTR_CLK. FIG. 3 qualitatively illustrates the noise energy resulting from phase jitter in the master clock signal. Curve 15 illustrates the noise energy from master clock phase jitter upon the fundamental of the switching frequency (e.g., at 384 kHz), while curve 17 illustrates the noise energy from this jitter upon the third harmonic of the switching frequency (i.e., centered at 1152 kHz in this example). As evident from FIG. 3, the noise energy from the fundamental and odd harmonics of the PWM switching frequency extends into the audible frequency band (e.g., around 20 kHz).

But master clock signal MSTR_CLK is typically generated using fractional synthesis from a 27 MHz crystal reference, and as such has wide-band phase noise, with multiple spurs. While a crystal-based master clock signal will itself not have significant phase jitter, it has been observed that jitter is still present due to the fractional synthesis circuitry for generating master clock signal MSTR_CLK from the 27 MHz crystal reference. Characterization of typical clock signals generated in this fashion shows that on the order of 20 dB of dynamic range in the digital audio system is lost due to typical phase jitter in this master clock signal, especially considering that this master clock signal MSTR_CLK is further frequency multiplied by a factor of sixteen or so in the generation of the high speed PWM clock. Conversely, 30 dB or more of jitter attenuation is required in the phase-locked loop, in order to produce a PWM clock signal with sufficiently low noise energy as to safely attain the desired level of 100 dB audio performance in an actual implementation.

Using conventional approaches, such a high degree of jitter attenuation typically requires a low closed-loop frequency in the phase-locked loop used to generate the PWM clock signal. And, as known in the art, low closed-loop frequency operation of a PLL generally requires a voltage-controlled oscillator and a loop filter that each have extremely low intrinsic noise. Analog implementation of such a PLL necessitates large passive components, which therefore must be external to the audio processor integrated circuit. These external components are not only costly to the system manufacturer, but also add to the cost of the integrated circuit realizing the PLL, by requiring additional integrated circuit chip and package space for connections to the external components.

As known in the art, the digital implementation of phase locked-loop circuits is attractive for many reasons. The cost and inefficiency resulting from external passive filter components makes a digital PLL implementation attractive. As noted above, the elimination of off-chip loop filter components to obtain performance on a par with low closed-loop frequency PLLs, is necessary in generating a high frequency clock signal from a relatively "sloppy" reference clock. Other benefits of digital PLL realizations include improved speed of design and design verification of the circuits, scalability and portability of digital designs to other applications and new manufacturing processes, reduced noise sensitivity due to operation in the digital domain, and reduced cost of manufacture because of the elimination of large analog circuits such as band-gap reference circuits and charge pumps.

By way of further background, conventional digital PLL circuits have been analyzed, in connection with the invention. In at least one example of a conventional application specific integrated circuit (ASIC) cell available from Texas Instruments Incorporated, the spectrum of phase noise showed notches at 8 MHz offsets from the center frequency, for such a PLL operating in response to an 8 MHz reference clock signal.

BRIEF SUMMARY OF THE INVENTION

It is therefore an object of this invention to provide an all-digital phase-locked loop circuit in which phase jitter of the reference clock signal is suppressed.

It is a further object of this invention to provide such a circuit that generates an extremely high frequency output signal, such as useful in the pulse-width modulation of audio signals.

It is a further object of this invention to provide such a circuit that can be implemented with digital circuitry of relatively modest complexity.

It is a further object of this invention to provide such a circuit that does not require external passive filter components, and that attains other advantages of digital circuitry such as improved speed of design and design verification, scalability and portability to other applications and new manufacturing processes, reduced noise sensitivity, and reduced cost of manufacture by eliminating large analog circuits such as band-gap reference circuits and charge pumps.

Other objects and advantages of this invention will be apparent to those of ordinary skill in the art having reference to the following specification together with its drawings.

The present invention may be implemented into an all-digital phase-locked loop circuit, including a digital controlled oscillator based on a pair of digitally controlled delay cells, that effectively implement a combined sinc filter and comb filter into the operation of converting a digital signal to a continuous waveform. The delay of the delay cells is based on the phase difference between a feedback signal and the reference clock signal, and preferably includes both coarse and fine control of the delay. Because of the inclusion of the combined sinc and comb filters in the digital controlled oscillator, the loop filter can be realized as a simple first order digital filter.

DETAILED DESCRIPTION OF THE INVENTION

The present invention will be described in connection with its preferred embodiment, namely as implemented into a digital phase-locked loop in a digital audio system. Such an implementation is described in this specification because it is contemplated that the benefits of this invention are particularly valuable in such an application. However, it is also contemplated that this invention may provide similar benefits in a wide range of applications and architectures. As such, it is to be understood that the following description is provided by way of example only, and is not intended to limit the true scope of this invention as claimed.

Figure 1:
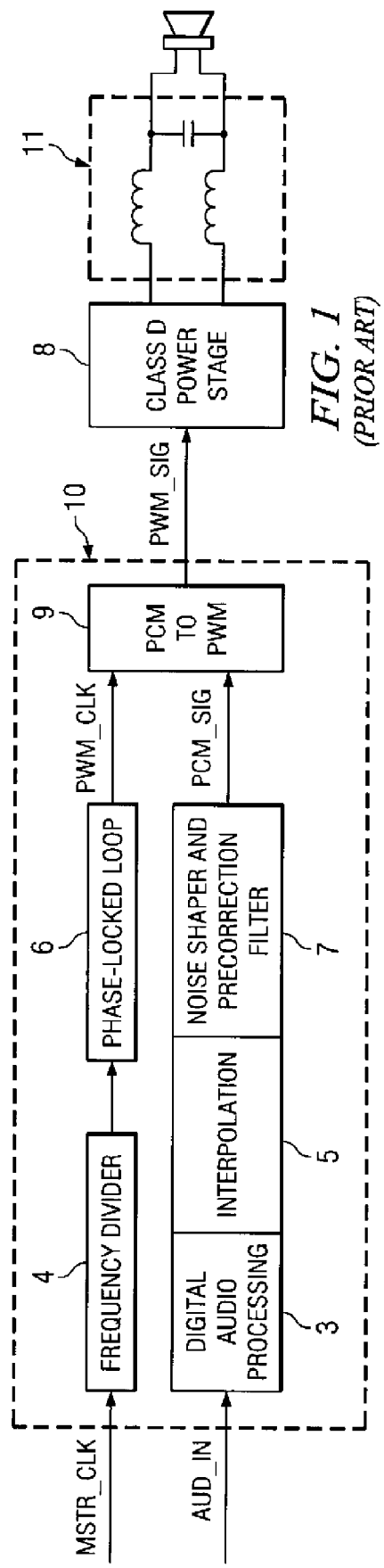
FIG. 1 is an electrical diagram, in block form, of a conventional digital audio system.
Figure 4:
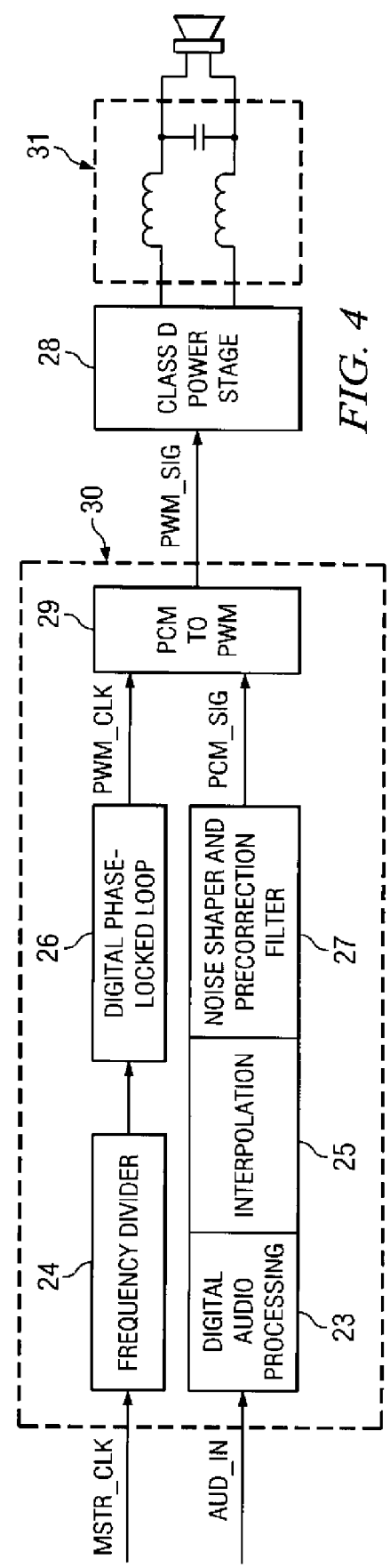
FIG. 4 is an electrical diagram, in block form, of a digital audio system constructed according to the preferred embodiment of the invention.
Figure 2:
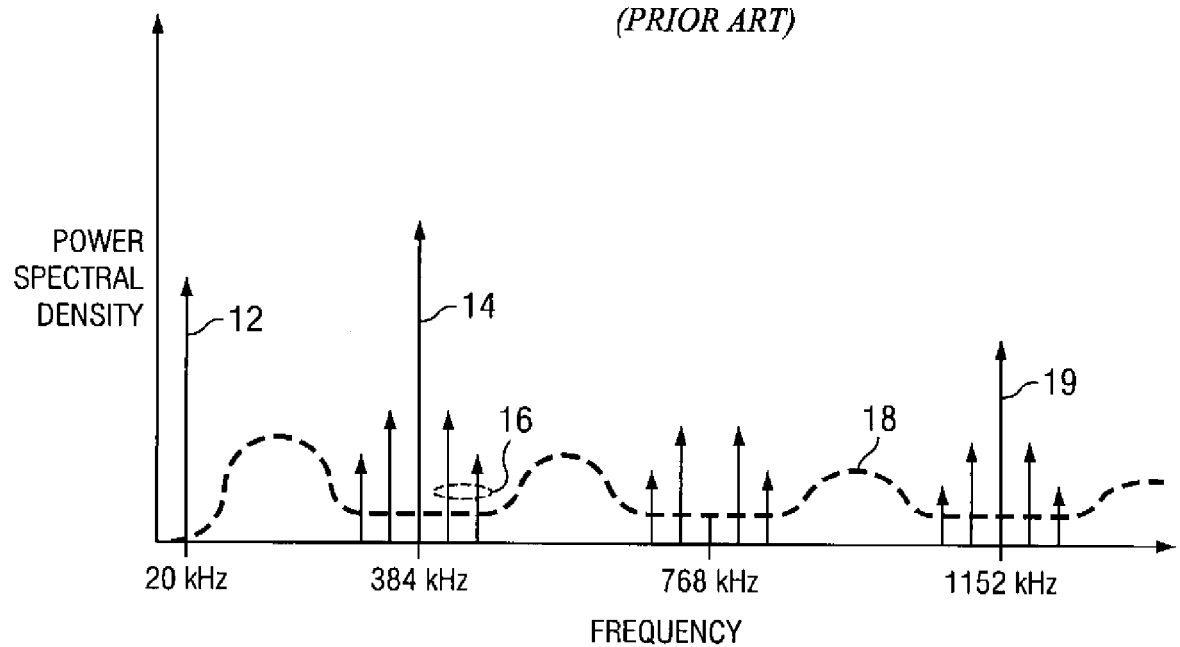
FIG. 2 is a plot of signal and noise energy power spectral densities for the pulse-width-modulated output signal in the system of FIG. 1.
Figure 3:
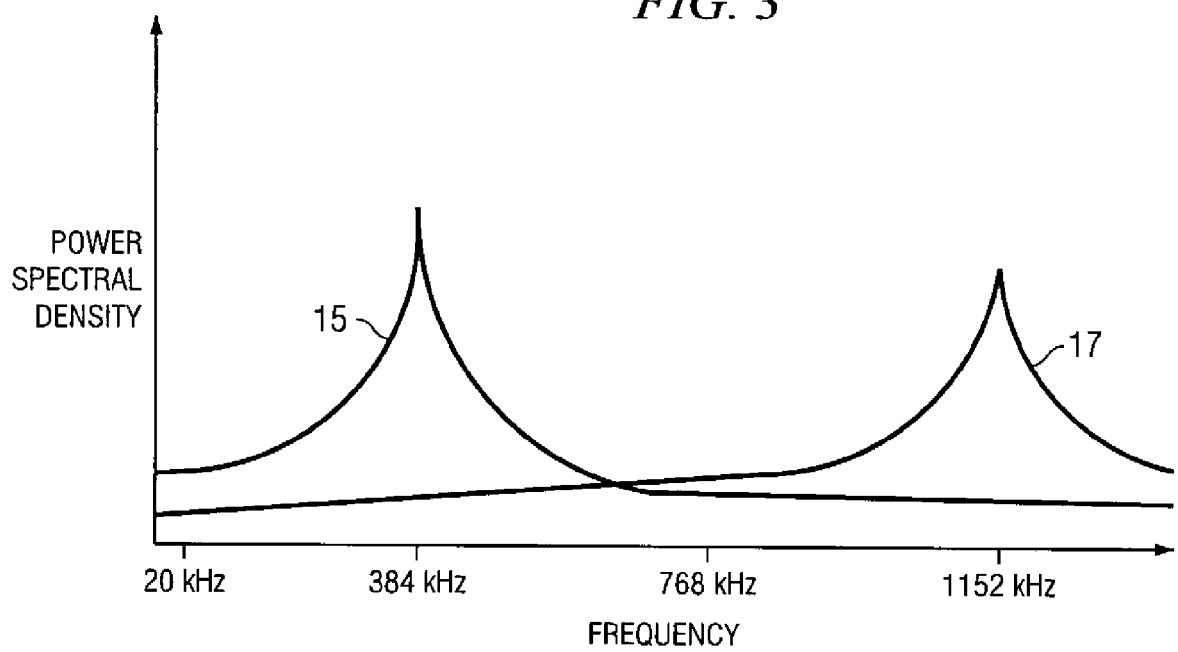
FIG. 3 is a plot of noise energy due to reference clock phase jitter, as observed according to this invention.

Referring now to FIG. 4, digital audio system 20 constructed according to the preferred embodiment of the invention will now be described. In the example of FIG. 4, only a single output channel (i.e., represented by speaker SPKR) is illustrated; it will be understood by those skilled in the art having reference to this specification, of course, that this invention can be readily adapted to multiple audio output channels. System 20 in this example is constructed, in at least a general sense, similarly as the conventional digital audio system discussed above relative to FIG. 1. As will become apparent from the following description, however, the audio performance of system 20 is greatly improved, relative to that conventional system, as a result of digital phase-locked loop 26 constructed according to the preferred embodiment of this invention.

By way of summary, the input audio signal in this example is communicated as thirty-two bit digital datastream AUD_IN to digital audio processing function 23, which preferably includes cascaded "biquad" digital filters and other conventional circuitry and functionality for performing conventional audio processing functions including parametric speaker equalization, graphic equalization, treble and bass adjustment, precision soft volume control, loudness compensation, dynamic range compression, noise squelch, center and subwoofer channel synthesis, programmable dither, peak limiting and clipping, and the like. It is contemplated that the digital filters and other processing applied by digital audio processing function 23 may be carried out by custom hardware or, in whole or in part, by a digital signal processor (DSP) executing the appropriate program instruction sequences, as known in the art. As in the conventional system, interpolation function 25 oversamples the processed digital audio signal, for example by a factor of eight. Noise shaper and pre-correction filter function 27 then applies conventional digital filter functions to move noise energy to frequencies that do not interfere with the eventual pulse-width-modulated output signal, to avoid generating audible noise. The output of function 27 in this example is pulse-code-modulated (PCM) signal PCM_SIG, which is converted to pulse-width-modulated (PWM) output signal PWM_SIG by PCM to PWM conversion function 29. As in the conventional system of FIG. 1, PWM output signal PWM_SIG drives power stage 28, in the form of a conventional class D power amplifier, and which drives speaker SPKR via its apparent LC filter 21. Class D power stage 28 may be realized as either a full-bridge or half-bridge output driver, as known in the art.

In this example, as before, sampling frequency $f_s$ is related to the frequency of the incoming digital audio signal AUD_IN, and PCM signal PCM_SIG has a frequency at a multiple of sampling frequency $f_s$ determined by interpolation function 25. For example, a typical sampling frequency $f_s$ for digital audio is 48 kHz, and a typical oversampling multiple is eight, resulting in a frequency of $8f_s$=384 kHz for the signal PCM_SIG as applied to PCM to PWM conversion function 29.

PCM to PWM conversion function 29, as mentioned above, converts the multiple-bit PCM signal PCM_SIG to output PWM signal PWM_SIG, which is at a frequency based upon PWM clock signal PWM_CLK that is generated by digital phase-locked loop (DPLL) 26. As before, PWM clock signal PWM_CLK is a very high frequency clock that defines the pulse width of the smallest PWM pulse generated by PCM to PWM function. Typically, for an eight-bit PCM signal PCM_SIG at a frequency of $8f_s$, PWM clock PWM_CLK will be at a frequency that is 512 times $8f_s$, to generate the preferred PWM clock as a double-sided symmetric PWM signal. Alternatively, as mentioned above, a "single-sided" PWM clock would be at a lower frequency of 256 times $f_s$. For a sampling frequency $f_s$ at 48 kHz, in the preferred double-sided symmetric case, PWM clock signal PWM_CLK will thus have a frequency of 196 MHz.

According to this invention, it has been observed that digital PWM amplifiers are sensitive to noise from phase jitter mainly at harmonics of the switching frequency. Additional analysis in connection with this invention has determined that, for audio performance of 100 dB or greater, the high-speed PWM clock (i.e., PWM clock PWM_CLK at 512 times $8f_s$; or 196 MHz in this example) must have less phase noise than about −96 dBc/Hz at an offset of 384 kHz. This extrapolates to a cycle-to-cycle jitter of on the order of picoseconds for master clock signal MSTR_CLK. As mentioned above, this extremely low jitter is far from achievable for master clock signal MSTR_CLK in system 20 of FIG. 4, because that signal is slaved to the audio input signal, and is generated by way of fractional synthesis from an external crystal reference, or from a 27 MHz video master clock. According to the preferred embodiment of the invention, digital PLL 26 is constructed to apply significant phase noise suppression to this relatively high jitter master clock signal MSTR_CLK, to attain the desired level of dynamic performance for system 20.

More specifically, as will be described in detail below, digital PLL 26 incorporates substantial digital filtering so that the phase noise spectrum exhibits substantial notches at harmonics of the switching frequency $8f_s$ (e.g., harmonics of 384 kHz). According to the preferred embodiment of the invention, this filtering is obtained by way of the combination of a sinc filter with a first order comb FIR filter, realized integrally with a digitally controlled oscillator (DCO) within digital PLL 26.

Figure 5:
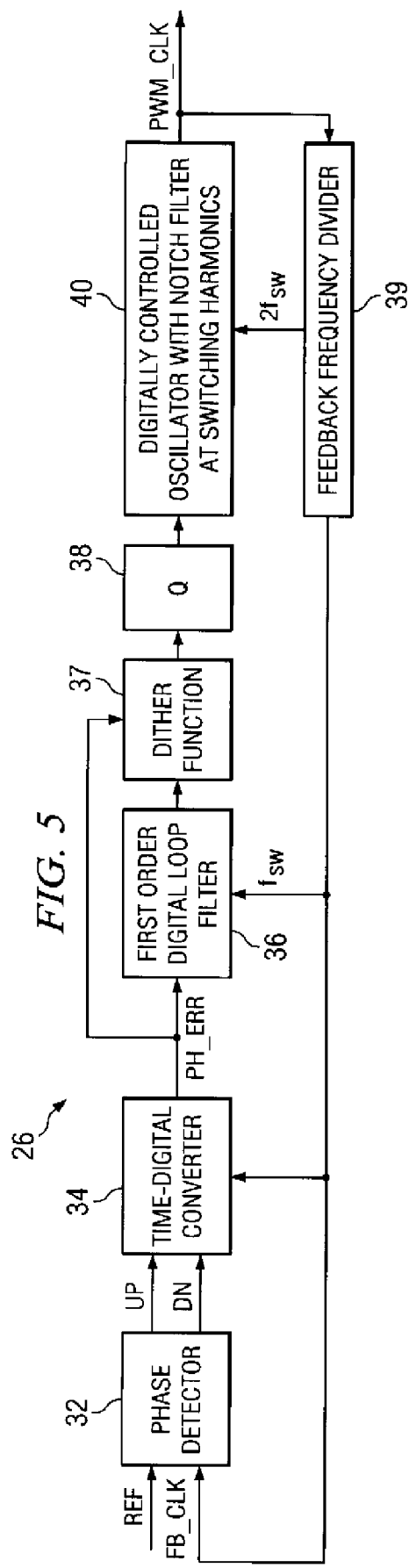
FIG. 5 is an electrical diagram, in block form, of an all digital phase-locked loop in the digital audio system constructed according to the preferred embodiment of the invention.

FIG. 5 illustrates the construction of digital PLL 26 according to this preferred embodiment of the invention. As shown, reference clock signal REF, generated by frequency divider 24 (FIG. 4) from master clock signal MSTR_CLK is applied to one input of phase detector 32. Phase detector 32 is a conventional digital logic circuit that generates signal UP, DN, each having a pulse width proportional to the leading and lagging phase delays, respectively, between its two inputs, which in this case are reference clock signal REF and feedback clock signal FB_CLK. Feedback clock signal FB_CLK is generated from the PWM clock signal PWM_CLK generated by digital PLL 26, after frequency division by feedback divider 39. Signals UP, DN are applied to time-to-digital converter 34, which converts the pulse widths and polarities indicating the relative phase delay to a digital value, and communicates this value as digital signal PH_ERR to digital loop filter 36.

Figure 6:
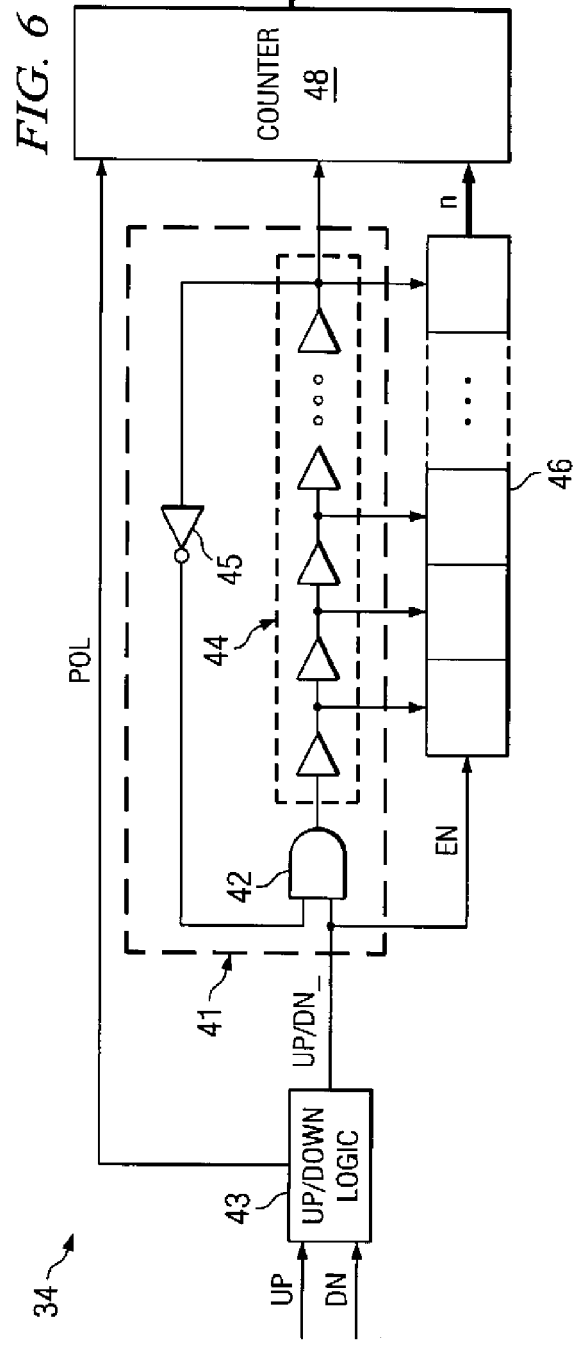
FIG. 6 is an electrical diagram, in schematic form, of the time-to-digital converter function in the phase-locked loop of FIG. 5 according to the preferred embodiment of the invention.

According to the preferred embodiment of the invention, time-to-digital converter 34 can be constructed as fully digital circuitry, as will now be described relative to its exemplary construction shown in FIG. 6. In this example, up/down logic 43 receives signals UP, DN from phase detector 32, and is constructed of simple logic to generate signal UP/DN_ as the logical OR of signals UP, DN, which will thus have a pulse width proportional to the phase delay of either polarity; up/down logic 43 also generates signal POL that indicates whether feedback signal FB_CLK lead or lags reference clock signal REF. Signal UP/DN_ is applied to gated ring oscillator 41, specifically to one input of AND gate 42 within gated ring oscillator 41. Gated ring oscillator 41 includes sequence 44 of non-inverting buffers, each acting as a delay stage of relatively short duration (e.g., on the order of 50 psec). The output of each buffer in sequence 44 is coupled to the input of the next buffer in sequence 44 and to a bit of latch 46. Latch 46 is arranged as one bit for each of the buffers in sequence 44, and has an enable input receiving signal UP/DN_ from up/down logic 43. Inverter 45 feeds back the output of the last buffer in sequence 44 to an input of AND gate 42 to generate the oscillation; this last buffer output is also forwarded to an advance input of counter 48. Counter 48 also receives the state of latch 46, over n lines corresponding to the n states of latch 46 and thus the n buffers of sequence 44, and preferably also includes decoding circuitry for interrogating the contents of latch 46 communicated on these lines. Counter 48 also receives polarity signal POL from up/down logic 43, so that it can comprehend the polarity of the phase error (leading or lagging).

Alternatively, two instances of gated ring oscillator 41 may be realized, one for processing leading phase delays between reference clock signal REF and feedback clock signal FB_CLK, and the other for processing lagging phase delays. In this case, counter 48 would receive advance signals and latch states from the instance of gated ring oscillator 41 that is active for the current phase delay polarity.

In operation, upon phase detector 32 detecting a phase difference between reference clock REF and feedback signal FB_CLK and asserting the appropriate signal UP or DN, signal UP/DN_ is asserted to a high logic level for a pulse width corresponding to the phase difference between the two clock signals indicated by the active one of signals UP, DN. Up/down logic 43 also generates the appropriate polarity signal POL according to which of signals UP, DN is asserted. During the high logic level pulse of signal UP/DN_, latch 46 is enabled, and AND gate 42 enables oscillation through gated ring oscillator 42, by passing the output of inverter 45 to the first buffer of sequence 44. Each oscillation of gated ring oscillator 41 (e.g., a rising edge transition) during the duration of the high logic level pulse of signal UP/DN_advances counter 48. Upon the end of the pulse of signal UP/DN_, the states of the buffers in sequence 44 are captured in latch 46, and as such the position of the transition of the oscillating pulse at that time is known. Counter 48 then generates the value of signal PH_ERR from its count of the number of oscillations during the most recent pulse of signal UP/DN_, and from the position of the transition of the oscillating pulse as stored in latch 46, and according to the polarity of the phase delay (lead or lag) indicated by polarity signal POL. The digital phase error signal PH_ERR thus conveys the phase error to loop filter 36 (FIG. 5) at a resolution corresponding to the delay through a single buffer in sequence 44, which may be as short as on the order of 50 psec as mentioned above.

Referring back to FIG. 5, digital phase error signal PH_ERR is then applied to digital loop filter 36. Because of the construction of digital PLL 26 according to this preferred embodiment of the invention, as will be described in further detail below, it is contemplated that digital loop filter 36 can be realized by a simple first order infinite input response (IIR) of conventional arrangement, involving only two coefficients and one accumulation. It is contemplated that those skilled in the art are readily able to arrange digital loop filter 36 in this manner, for each particular application. Dither function 37 can be applied, if desired, to the output of digital loop filter 36, in combination with the unfiltered phase error signal PH_ERR, in the conventional manner.

Quantizer 38 receives processed phase error signal from filter 36 and dither function 37, which is in the form of a digital value corresponding to a phase difference between reference clock signal REF and feedback clock signal FB_CLK, and quantizes this digital signal into a one of a set of control code values, for application to digitally controlled oscillator (DCO) 40. As is fundamental in the art, DCO 40 operates in response to one of a finite set of discrete control code input values. However, the digital value from loop filter 36 and dither function 37 will not necessary match any of the values in this set of control code inputs. Quantizer 38 "rounds off" the digital value from loop filter 36 to one of the discrete and finite set of control code inputs to which DCO 40 responds. In this regard, quantizer 38 may convert the number of bits used to represent this output of loop filter 36 to fit the number of bits (e.g., twelve) of the control codes applied to DCO 40. According to the preferred embodiment of the invention, DCO 40 implements notch filtering at harmonics of the switching frequency, so that the effects of phase jitter on reference clock signal REF, and quantization noise due to the finite step size between digital input values to DCO 40 (as will be discussed below) are suppressed from appearing at audio frequencies.

As discussed above, it has been discovered, according to this invention, that digital PWM amplifiers are sensitive to noise from phase jitter mainly at harmonics of the switching frequency. In the example of system 20 of FIG. 4, this sensitivity is exhibited at the switching frequency of PCM signal PCM_SIG as applied to PCM to PWM converter 29. As described above, this switching frequency is at $8f_s$, which is about 384 kHz for a 48 kHz input audio signal, which is typical in modern digital audio amplifiers. Therefore, according to the preferred embodiment of the invention, DCO 40 implements notch filtering at harmonics (more specifically, odd harmonics) of this PCM switching frequency, as will now be described.

Figure 7:
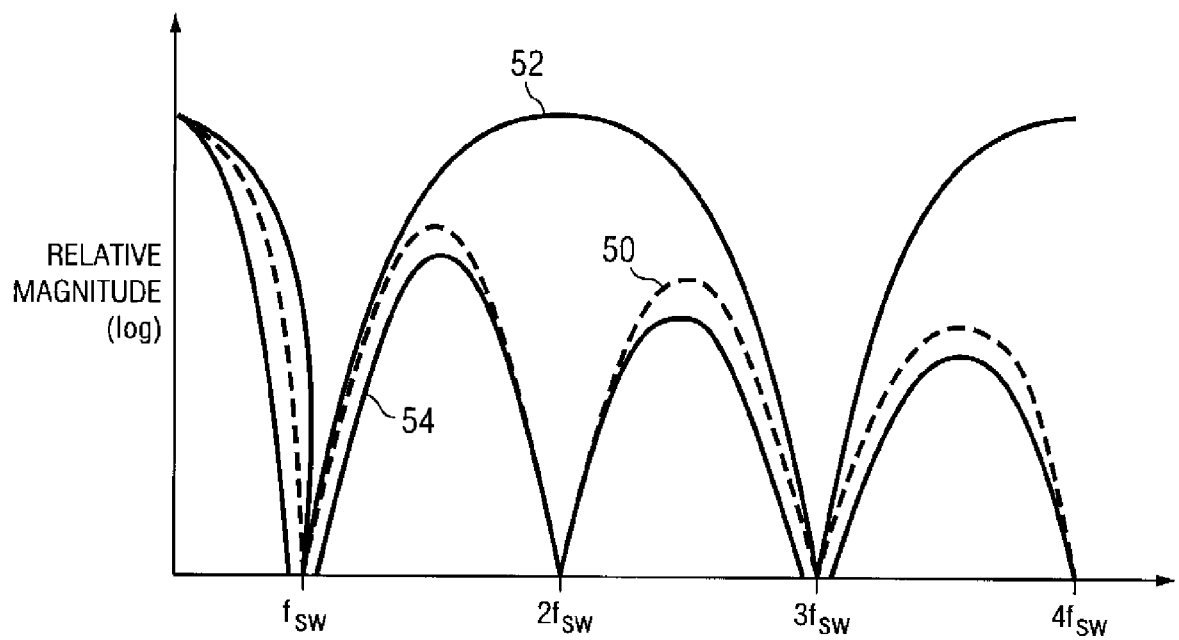
FIG. 7 is a plot of the spectral characteristics of sinc and comb filters, as applied according to the preferred embodiment of the invention.

FIG. 7 illustrates the spectral behavior of filter functions realized within DCO 40 according to the preferred embodiment of the invention. Curve 50 illustrates the spectrum of a conventional "sinc" filter, corresponding to a zero-order sample and hold, which provides notches at all harmonics of its sampling frequency $f_{SW}$. Since notches are desired in DCO 40 at harmonics of switching frequency $8f_s$, this sinc filter can be applied at a sampling frequency $f_{SW}=8f_s$, so long as the output frequency of DCO 40 is not changed more than once per PWM period. Curve 52 of FIG. 7 illustrates the spectrum of a conventional "comb" filter, having notches at odd harmonics of frequency $f_{SW}$. As known in the art, an analog FIR comb filter of this characteristic can be easily realized by sampling the input signal at frequency $f_{SW}$, and summing the sampled signal with a sample of itself that has been delayed by one-half the sample period. Curve 54 illustrates the characteristic of a filter combining these two characteristics, in which the notches at odd harmonics of frequency $f_{SW}$ are deepened and widened.

According to this invention, DCO 40 is constructed to include the filter characteristic of the combination of the sinc and comb filters. As mentioned above, this filter characteristic is effective to suppress the effects of phase jitter on reference clock signal REF. In addition, the combination of the sinc and comb filters within DCO 40 is also effective to suppress quantization noise in the system. For example, in response to a digital error signal that is between control code values, the output of quantizer 38 will oscillate between these control code values; this will, in turn, cause VCO 40 to generate an output clock signal at a frequency that is, on the average, between that defined by those control code values. However, this oscillation inserts quantization noise into the system. While the magnitude of this quantization noise could be reduced by reducing the step size of the inputs to DCO 40, this reduction is limited by the cost of the additional transistors required for this increased resolution. According to this embodiment of the invention, however, this quantization noise is suppressed by the combination of the sinc and comb filters within DCO 40. In effect, the sinc and comb filters shape the phase noise due both to jitter and also due to this quantization, so that the effects of these noise sources on the output PWM clock signal is minimal; in addition, this noise shaping permits the step size between DCO input control codes to be relatively large, relaxing the circuit requirements and reducing the implementation cost.

In addition, according to the preferred embodiment of the invention, these filters can be realized in an especially efficient and elegant manner, as will now be described relative to FIG. 8. More specifically, as will be described in detail below, digital PLL 26 incorporates substantial digital filtering so that the phase noise spectrum exhibits substantial notches at harmonics of the switching frequency $8f_s$ (e.g., harmonics of 384 kHz). According to the preferred embodiment of the invention, this filtering is obtained by way of the combination of a sinc filter with a first order comb FIR filter, realized integrally with a digitally controlled oscillator (DCO) within digital PLL 26.

Figure 8:
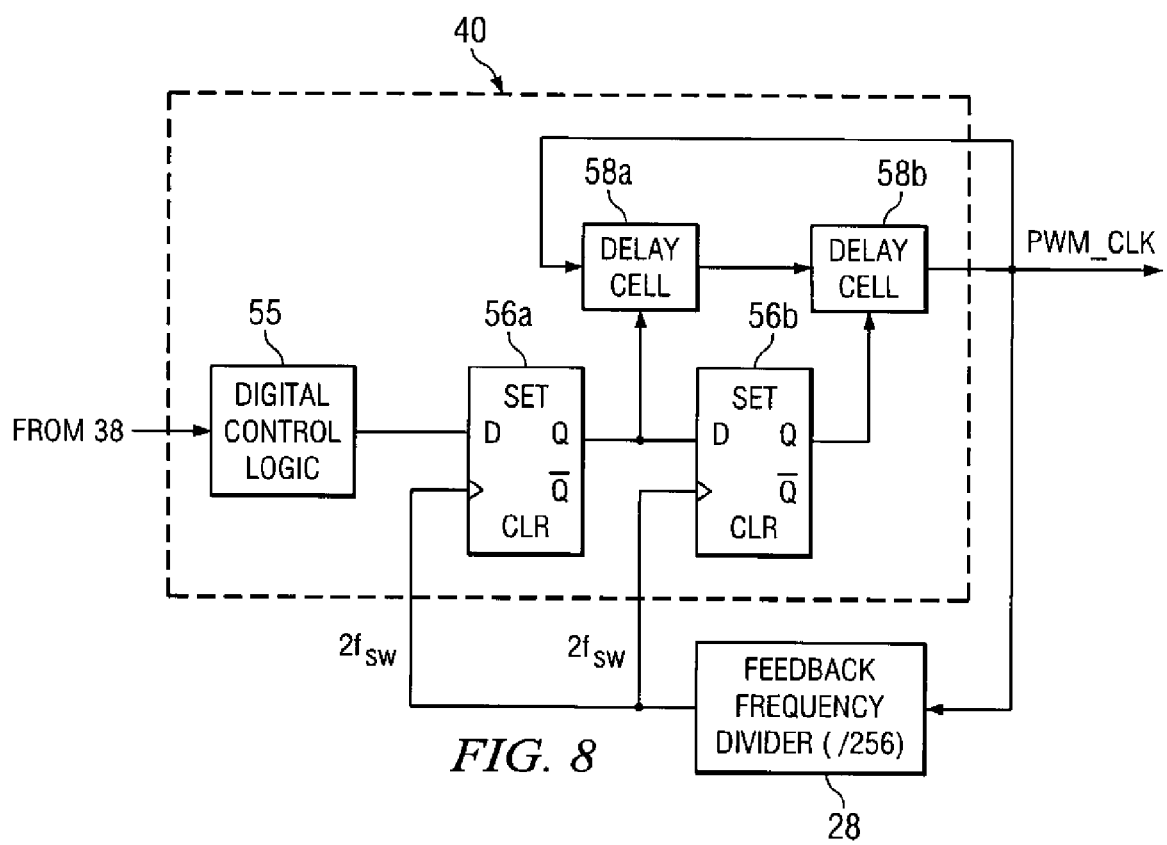
FIG. 8 is an electrical diagram, in block form, of the digitally controlled oscillator in the phase-locked loop of FIG. 5 according to the preferred embodiment of the invention.

Referring now to FIG. 8, the construction of DCO 40 according to the preferred embodiment of the invention will now be described. Digital control logic 55 in DCO 40 receives the processed digital phase error value from quantizer 38 (FIG. 5). As discussed above, this digital phase error value is a digital word indicating the relative phase delay between the reference clock signal REF and the feedback clock signal FB_CLK, as detected by phase detector 32, filtered by loop filter 36 (dithered, as desired, by dither function 37), and quantized to one of the discrete input control code values that DCO 40 requires. Digital control logic 55, as will be described below, encodes the phase error value and generates a digital control word that will control the output frequency from DCO 40. In this preferred embodiment of the invention, the digital control word output by digital control logic 55 is stored by latch 56a, upon a transition of a clock signal generated by feedback frequency divider 28 from the output clock signal PWM_CLK. The digital control word latched by latch 56a is forwarded to the input of latch 56b, and is latched therein on the next occurrence of the clock signal transition from feedback frequency divider 28. While latches 56a, 56b are shown in FIG. 8 as single bit flip-flops, it is to be understood that the digital control word stored by latch 56a, 56b will generally be a multiple bit word; as will be described in further detail below according to an exemplary embodiment, this multiple bit word may involve 128 bits, arranged as two sixty-four-bit thermometer coded control words, one word for coarse delay control and the other for fine delay control. The contents of latch 56a, corresponding to a sample of this digital control word, are forwarded to first delay cell 58a, and controls its propagation delay. Similarly, the contents of latch 56b, corresponding to a previous sample value of the digital control word (relative to the contents of latch 56a), are forwarded to delay cell 58b to control its propagation delay. Delay cells 58a, 58b are connected into a ring oscillator (i.e., with the output of delay cell 58a connected to the input of delay cell 58b, and the output of delay cell 58b in turn connected to the input of delay cell 58a), with the output of delay cell 58b driving the output clock signal PWM_CLK. Output clock signal PWM_CLK is also forwarded to feedback frequency divider 28.

As discussed above relative to FIG. 7, according to this preferred embodiment of the invention, notches in the filter characteristic at odd harmonics of the PCM switching frequency $f_{SW}$ is desired, in order to eliminate phase noise from those frequencies, and thus from the audio band. This requires the sinc and comb filters to operate at a sampling frequency equal to the switching frequency $f_{SW}$ divided by an integer. While the following examples illustrate that this sampling frequency and switching frequency are exactly equal, for the sake of clarity, it is contemplated that a lower sampling frequency can provide more flexibility in the PLL ratio between input and output frequencies, because the notches in the filter characteristic will still appear at $f_{SW}$ from a sampling frequency that is divided down from $f_{SW}$ by an integer N (i.e., at the Nth harmonic of the sampling frequency).

For the example of FIG. 8, the frequency of output clock signal PWM_CLK is 512 times the PCM switching frequency $f_{SW}=8f_s$. According to the preferred embodiment of the invention, therefore, feedback frequency divider 28 divides down the output clock signal PWM_CLK frequency by a factor of 256, such that the clock signals applied to latches 56a, 56b is at twice the switching frequency $f_{SW}$. In this manner, latch 56a samples the output of digital control logic 55 at twice the switching frequency $f_{SW}$, and latch 56b effectively "samples" that same digital word also at twice the switching frequency $f_{SW}$. However, the sampling frequency of latches 56a, 56b is twice that of switching frequency $f_{SW}$, and the phase error value, as filtered and processed, is only updated once per period (at switching frequency $f_{SW}$), as evidenced by the feedback clock applied to loop filter 36 from feedback divider 28 (FIG. 5). Therefore, latch 56a effectively operates as a zero-order sample-and-hold at switching frequency $f_{SW}$, and latch 56b effectively acquires the half-sample delayed value, also at switching frequency $f_{SW}$, for the comb filter operation. As such, the control of the frequency of DCO 40, by digitally controlling the propagation delay of delay cells 58a, 58b, effectively applies the sum of a sinc filter and a comb filter to the digital control word based on the phase error. This summing operation occurs, according to this embodiment of the invention, because each of delay cells 58a, 58b has the same effect on the frequency of output clock signal PWM_CLK.

Figure 9:
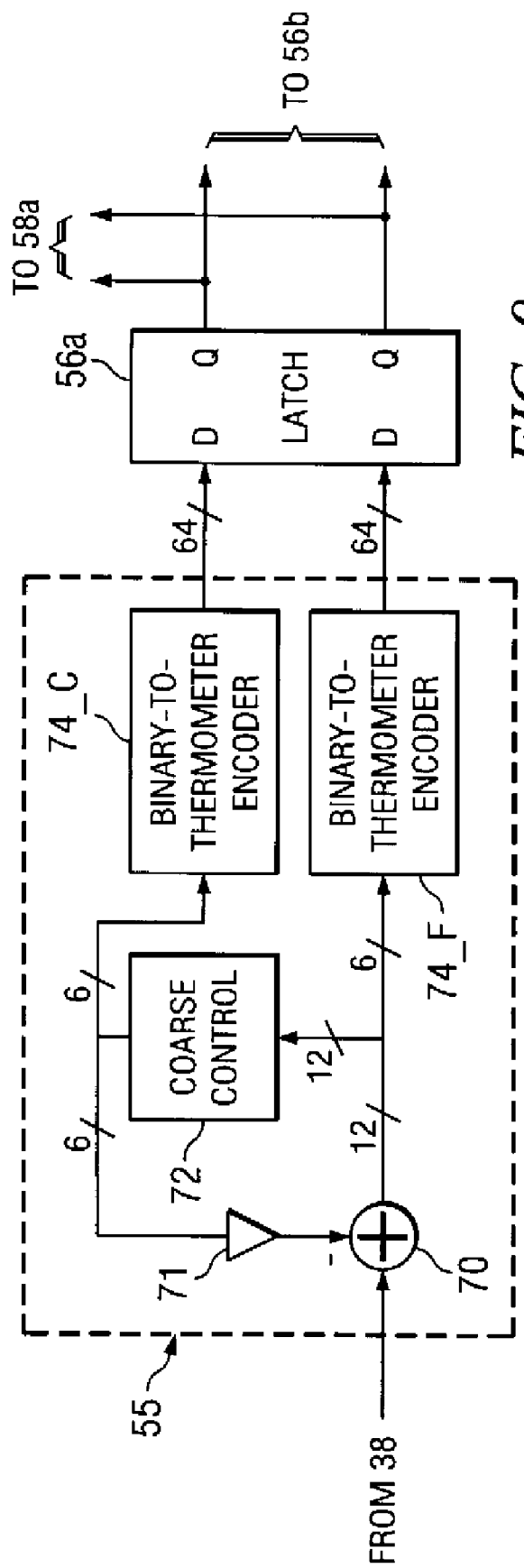
FIG. 9 is an electrical diagram, in block form of the digital control logic in the digitally controlled oscillator in the phase-locked loop of FIG. 5 according to the preferred embodiment of the invention.

According to the preferred embodiment of the invention, coarse and fine control and adjustment of the propagation delay through each of delay cells 58a, 58b is implemented in DCO 40. This feature requires the processing of the filtered and processed digital phase error values, which in this example is performed by digital control logic 55. Referring now to FIG. 9, the construction of digital control logic 55 in generating coarse and fine digital control words according to the preferred embodiment of the invention will now be described.

The quantized digital phase error value from quantizer 38 is applied to one input of adder 70. An inverting input to adder 70 (i.e., which is subtracted from the output of quantizer 68), is received from coarse control 72 via buffer 71. The output of adder 70 presents a twelve-bit digital value; the six most significant bits are forwarded to coarse control 72, while the six least significant bits are forwarded to binary-to-thermometer encoder 74_F for generation of the encoded fine adjustment digital control word. Coarse control function 72 adjusts the six MSBs from adder 70, preferably to maintain the fine adjustment digital value near the center of an adjustment range; for example, the six LSBs may be interrogated, and if their value is too close to 0 or $111111_2$, the MSB value may be adjusted accordingly (it being assumed, in this example, that there is overlap between adjacent "coarse" steps). It is contemplated that coarse control function 72 will largely be inactive, other than during lock-in of the PWM clock and in response to frequency and temperature drift. The result of coarse control function 72 is applied to binary-to-thermometer encoder 74_C, and to buffer 71 for feedback to adder 71 as mentioned above.

According to the preferred embodiment of the invention, and considering the construction of delay cells 58a, 58b as will be described below, it is preferred that the actual digital control word applied to delay cells 58a, 58b be encoded according to the well-known "thermometer" code. As known in the art, thermometer coding refers to a binary code in which a digital word of n bits is encoded into a digital word of $2^n$ bits, with the value of the n bit digital word indicating how many of the bits of the encoded word are "1". For example, a digital value $1011_2$ would be represented, in thermometer coding, as 111 1111 1111 (eleven bits of "1" value).

As such, binary-to-thermometer encoders 74_C, 74_F each encode the six bit digital values of the coarse and fine adjustment digital control words, respectively, into thermometer-encoded values. As such, the output of each of binary-to-thermometer encoders 74_C, 74_F are each sixty-four bits in width ($2^6=64$), and are applied to respective inputs of latch 56a as will be described below. The outputs of latch 56a, grouped into fine and coarse thermometer encoded words, are applied to delay cell 58a and to corresponding inputs of latch 56b, as discussed above and as will be discussed in further detail below. In operation, therefore, digital control logic 55 receives the filtered digital phase error values from quantizer 38, and encodes these values into coarse and fine thermometer code values, for sampling and filtering by latches 56a, 56b, and application to delay cells 58a, 58b in the oscillator of DCO 40.

Figure 10:
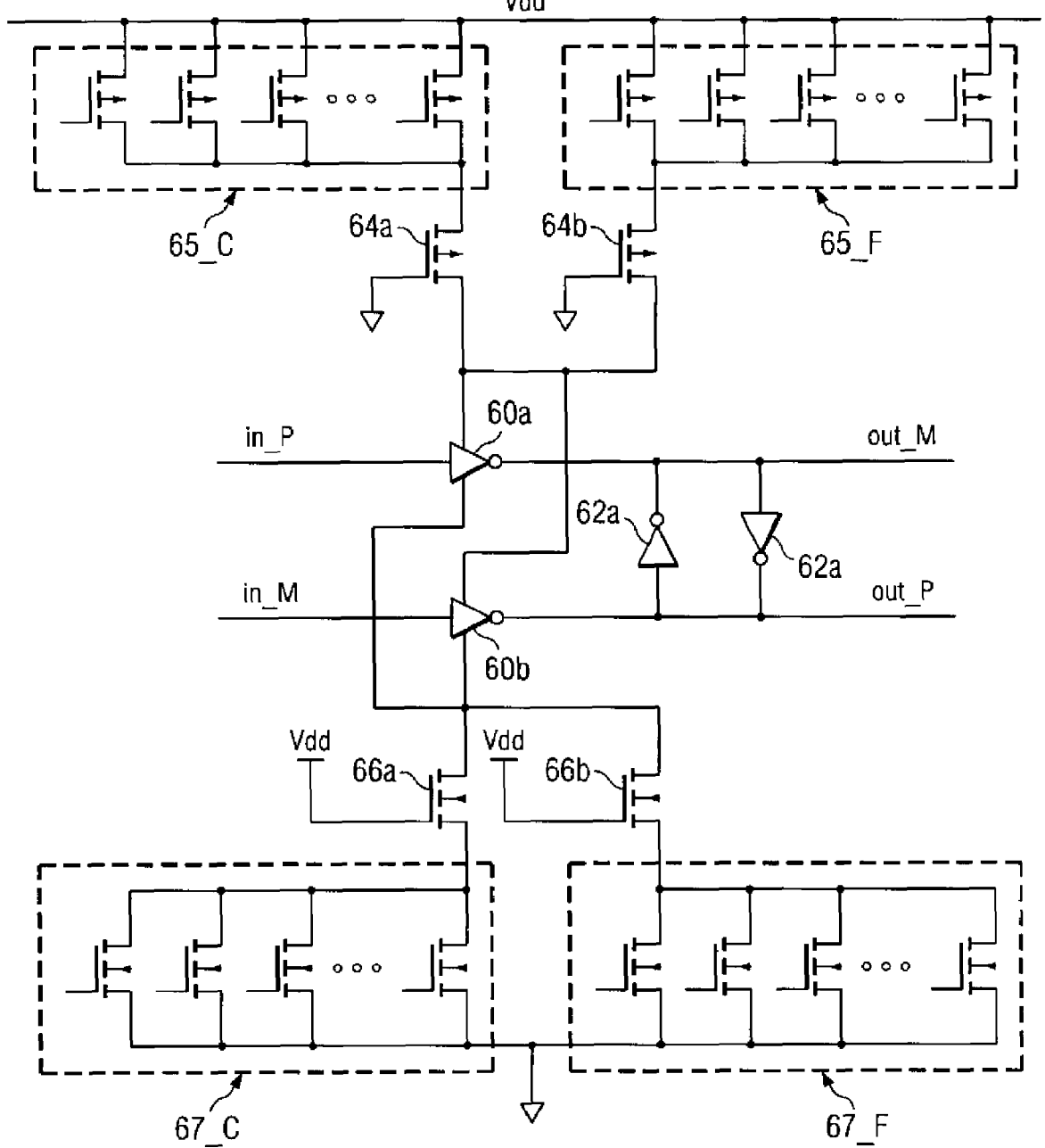
FIG. 10 is an electrical diagram, in schematic form, of a delay cell in the digitally controlled oscillator in the phase-locked loop of FIG. 5 according to the preferred embodiment of the invention.

Referring now to FIG. 10, the construction of delay cell 58a according to the preferred embodiment of the invention will be described in detail. For purposes of matching, and to best effect the summing of the sinc and comb filters, delay cell 58b is preferably constructed as a duplicate of delay cell 58a. According to this embodiment of the invention, delay cell 58a has differential inputs in_P, in_M, and differential outputs out_P, out_M. To realize the oscillator, differential outputs out_M, out_P of delay cell 58a are connected to differential inputs in_P, in_M, respectively, of delay cell 58b, and differential outputs out_M, out_P of delay cell 58b are connected to differential inputs in_P, in_M, respectively, of delay cell 58a.

Delay cell 58a is based on a pair of inverters 60a, 60b. Inverter 60a has its input coupled to input in_P, and its output driving output out_M; conversely, inverter 60b receives input in_M at its input, and drives output out_P. Connected to outputs out_M, out_P is a latch of inverters 62a, 62b. The input of inverter 62a is connected to output out_P, and the output of inverter 62a is connected to output out_M; inverter 62b has its input connected to output out_M, and its output connected to output out_P. Inverters 62a, 62b are constructed to be substantially smaller, and thus with weaker drive, than inverters 60a, 60b, such that inverters 60a, 60b can overdrive the state held by the latch of inverters 62a, 62b. However, in the absence of drive from inverters 60a, 60b, or during state transitions, the latch of 62a, 62b holds the previous state, thus providing some amount of hysteresis to stabilize delay cell 58a.

The propagation delay of delay cell 58a is controlled by the insertion of resistance into the bias paths of inverters 60a, 60b from the Vdd power supply, and from ground. More specifically, inverters 60a, 60b are both coupled to the Vdd power supply through a coarse adjustment leg of p-channel metal-oxide-semiconductor (MOS) transistor 64a and p-channel MOS transistor bank 65_C and also through a fine adjustment leg of p-channel MOS transistor 64b and p-channel MOS transistor bank 65_F. More specifically, the high voltage bias terminals of inverters 60a, 60b are connected in common to the drain of transistor 64a, which has its gate at ground potential. The p-channel transistors in bank 65_C have their source/drain paths connected in parallel between the source of transistor 64a and the Vdd power supply. In the fine adjustment leg, the high voltage bias terminals of inverters 60a, 60b are connected to the drain of transistor 64b, which also has its gate at ground. The p-channel transistors in bank 65_F have their source/drain paths connected in parallel between the source of transistor 64b and the Vdd power supply. According to this preferred embodiment of the invention, each of the transistors in banks 65_C, 65_F are constructed substantially identically as one another, preferably at minimum sizes (channel length and channel width). The gates of these transistors in banks 65_C, 65_F are driven by individual bits of thermometer-encoded coarse and fine digital control words, respectively, from latch 56a. The distinction between the coarse and fine control effected by banks 65_C, 65_F, respectively, is preferably due to the construction of series transistors 64a, 64b relative to one another. For example, coarse adjustment transistor 64a preferably has higher drive (e.g., shorter channel length) than fine adjustment transistor 64b (e.g., which has a longer channel length).

The ground bias of inverters 60a, 60b is similarly arranged, but with complementary transistors, as the high voltage bias described above. The ground bias terminals of inverters 60a, 60b are connected in common to the drain of n-channel transistor 66a, which has its gate at Vdd. The n-channel transistors in bank 67_C have their source/drain paths connected in parallel between the source of transistor 66a and ground. Similarly, in the fine adjustment leg, the ground bias terminals of inverters 60a, 60b are connected to the drain of transistor 66b, which also has its gate at Vdd. The n-channel transistors in bank 67_F have their source/drain paths connected in parallel between the source of transistor 66b and ground. Again, each of the transistors in banks 67_C, 67_F is constructed substantially identically as one another, preferably at minimum sizes (channel length and channel width). The gates of these transistors in banks 67_C, 67_F are driven by individual bits of thermometer-encoded coarse and fine digital control words, respectively, from latch 56a, preferably in parallel with the transistors in banks 65_C, 65_F. Coarse adjustment transistor 66a again preferably has higher drive (e.g., shorter channel length) than fine adjustment transistor 66b (e.g., which has a longer channel length).

According to this preferred embodiment of the invention, as discussed above, the digital control word generated by digital control logic 55 includes two control words, one for coarse adjustment and one for fine adjustment, and with each control word corresponding to the well-known "thermometer" code. The coded word for coarse adjustment from binary-to-thermometer encoder 74_C (via latch 56a) is applied to the gates of transistors in banks 65_C, 67_C, in parallel, and the coded word for fine adjustment from binary-to-thermometer encoder 74_F (via latch 56a) is applied to the gates of transistors in banks 65_F, 67_F, in parallel. As such, the same number of transistors are turned on, for a given control word value, in bank 65_C as in bank 67_C, and in bank 65_F as in bank 67_F.

In the case of delay cell 58b, the gates of the transistors in banks 65, 67 are driven by individual bits of the thermometer-encoded coarse and fine digital control words from latch 56b.

In operation, the number of transistors turned on in each of banks 65, 67 determine the resistance in the Vdd and ground bias legs of inverters 60a, 60b, and thus the speed with which inverters 60a, 60b change state in response to a transition at inputs in_P, in_M. In each case, the fewer transistors that are turned on in each bank 65, 67 (minimum being one transistor), the longer the propagation delay through delay cell 58a; conversely, propagation delay is reduced with more transistors that are turned on. And because the drive of transistors 64b, 66b is substantially less than that of corresponding transistors 64a, 66a, respectively, the turning on or off of a single transistor in bank 65_C or 67_C will cause a larger effect than the turning on or off of a single transistor in bank 65_F, 67_F, respectively, thus affecting coarse and fine adjustment of the propagation delay.

This construction of delay cells 58a, 58b provides important advantages in the generation of a high-speed PWM clock, as produced by DCO 40 in this example. The direct digital control of the propagation delay avoids the need for digital-to-analog conversion, as in conventional DCOs, and permits extremely fine control of the oscillator frequency. In addition, there is no need for a voltage reference, such as generated by a bandgap reference circuit, which reduces the noise generated by DCO and such reference circuits; in addition, the substantial chip area required for such voltage reference circuits is saved. Furthermore, since most of the transistors in delay cells 58a, 58b operate in a full digital (on or off) mode, sensitivity of the oscillator to substrate noise and other noise is greatly reduced. And the operation of delay cells 58a, 58b in rapidly driving their differential output lines from rail-to-rail further reduces noise sensitivity. The latch at the output nodes also realizes common mode control of the oscillator.

According to the preferred embodiment of the invention, therefore, substantial benefits are obtained in the generation of high speed clock signals, particular high speed PWM clock signals as used to drive class D audio output amplifiers. In particular, an all-digital phase-locked loop is provided in which phase noise, due to jitter in the reference clock signal is substantially suppressed from the audio band because of the implementation of the combination of a sinc and comb filter within the digitally controlled oscillator of the phase-locked loop that realizes notches in the phase error noise at harmonics of the PCM signal being converted into the PWM output clock. This invention eliminates the need for a digital-to-analog converter and corresponding voltage-controlled oscillator in the phase-locked loop, and thus eliminates the need for fabricating analog transistors into the circuit, and also avoids the noise vulnerability of such analog devices and circuits. In addition, such high chip area circuits as band-gap voltage reference circuits, charge pumps, and analog filters are avoided. Furthermore, the excellent performance of the preferred embodiment of the invention is equivalent to that of an analog PLL with a low closed-loop frequency, while not requiring the large external passive components that such an analog PLL would require to attain such performance.

In addition, the performance attained by the digital phase-locked loop of this invention is sufficient for high fidelity audio systems, even with substantial jitter in the reference clock signal. As observed by way of modeling, the jitter suppression provided by the preferred embodiment of the invention is sufficient to provide 106.5 dB dynamic range. In effect, the jitter suppression provided by this invention causes other effects, such as intermodulation of noise shaper out-of-band noise with the phase error noise, to limit the ultimate performance. In addition, it has been observed through modeling that the relationship of the PWM frequency to the sampling frequency $f_s$, can provide additional jitter suppression if the PWM clock signal has a quadrature phase relative to the sampling clock. Of course, in multiple channel audio systems in which interchannel delay is introduced, as known in the art, not all channels can thus be at this quadrature sampling point, and thus not all channels can benefit from this additional performance.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A digital phase-locked loop, comprising:
   phase measurement circuitry, for generating a digital phase error signal corresponding to a phase delay between a reference clock and a feedback signal;
   a loop filter, having an input coupled to the phase measurement circuitry;
   a digitally controlled oscillator, comprising:
   digital control logic, having an input coupled to the loop filter, for generating a delay control word;
   a sampling circuit, for sampling the delay control word; the sampling circuit including a first latch, having an input coupled to the digital control logic, having an output, and having a clock input; and a second latch, having an input coupled to the output of the first latch, having an output, and having a clock input;
   an oscillator comprised of first and second delays that are controllable responsive to successive samples of the delay control word; and
   a feedback circuit, having an input coupled to the oscillator, for generating the feedback signal to the phase measurement circuitry, and having an output coupled to the clock inputs of the first and second latches of the sampling circuit;
   wherein the digital control logic generates values of the digital control word at a first frequency;
   and wherein the feedback circuit clocks the first and second latches at substantially twice the first frequency.

2. The digital phase-locked loop of claim 1, wherein the oscillator comprises;
   first and second delay cells in sequence, the first delay cell having a control input coupled to the output of the first latch, and the second delay cell having a control input coupled to the output of the second latch.

3. The digital phase-locked loop of claim 2, wherein the first delay cell comprises:
   a first inverter, having an input and an output;
   a first bias leg, comprising:
   a first transistor, having a conduction path coupled between a power supply voltage and a bias terminal of the first inverter; and
   a first transistor bank, comprising a plurality of transistors that each have a conductive path coupled in series with the conduction path of the first transistor, and in parallel with the conduction paths of the others of the plurality of transistors in the first transistor bank, and each having a control electrode coupled to the output of the first latch; and
   a second bias leg, comprising:
   a second transistor, having a conduction path coupled between a reference potential and a reference terminal of the first inverter;
   a second transistor bank, comprising a plurality of transistors that each have a conductive path coupled in series with the conduction path of the second transistor, and in parallel with the conduction paths of the others of the plurality of transistors in the second transistor bank, and each having a control electrode coupled to the output of the first latch.

4. The digital phase-locked loop of claim 3, wherein the first bias leg further comprises:
   a third transistor, having a conduction path coupled between the power supply voltage and the bias terminal of the first inverter; and
   a third transistor bank, comprising a plurality of transistors that each have a conduction path coupled in series with the conduction path of the third transistor, and in parallel with the conduction paths of the others of the plurality of transistors in the third fine transistor bank, and each having a control electrode coupled to the output of the first latch;
   and wherein the second bias leg further comprises:
   a fourth transistor, having a conduction path coupled between the reference potential and the reference terminal of the first inverter; and
   a fourth transistor bank, comprising a plurality of transistors that each have a conductive path coupled in series with the conduction path of the fourth transistor, and in parallel with the conduction paths of the others of the plurality of transistors in the fourth transistor bank, and each having a control electrode coupled to the output of the first latch.

5. The digital phase-locked loop of claim 4, wherein the third transistor has a reduced drive capability relative to the first transistor;
   and wherein the fourth transistor has a reduced drive capability relative to the second transistor.

6. The digital phase-locked loop of claim 3, wherein the second delay cell comprises:
   a first inverter, having an input and an output;
   a first bias leg, comprising:
   a first transistor, having a conduction path coupled between a power supply voltage and a bias terminal of the first inverter; and
   a first transistor bank, comprising a plurality of transistors that each have a conductive path coupled in series with the conduction path of the first transistor, and in parallel with the conduction paths of the others of the plurality of transistors in the first transistor bank, and each having a control electrode coupled to the output of the second latch; and
   a second bias leg, comprising:
   a second transistor, having a conduction path coupled between a reference potential and a reference terminal of the first inverter; and
   a second transistor bank, comprising a plurality of transistors that each have a conductive path coupled in series with the conduction path of the second transistor, and in parallel with the conduction paths of the others of the plurality of transistors in the second transistor bank, and each having a control electrode coupled to the output of the second latch.

7. The digital phase-locked loop of claim 6, wherein the first delay cell further comprises:
   a second inverter, having an input and an output, having a bias terminal coupled to the first bias leg, and having a reference terminal coupled to the second bias leg; and
   a pair of latching inverters, coupled between the output of the first inverter and the output of the second inverter.

8. The digital phase locked loop of claim 6, wherein the first delay cell further comprises:
   a second inverter, having an input and an output, having a bias terminal coupled to the first bias leg, and having a reference terminal coupled to the second bias leg;
   wherein the second delay cell further comprises:
   a second inverter, having an input and an output, having a bias terminal coupled to the first bias leg, and having a reference terminal coupled to the second bias leg;
   wherein the output of the first inverter of the first delay cell is coupled to the input of the first inverter of the second delay cell;
   wherein the output of the second inverter of the first delay cell is coupled to the input of the second inverter of the second delay cell;

wherein the output of the first inverter of the second delay cell is coupled to the input of the first inverter of the first delay cell;

and wherein the output of the second inverter of the second delay cell is coupled to the input of the second inverter of the first delay cell.

9. The digital phase-locked loop of claim 1, wherein the loop filter comprises a first order digital filter.

10. A method of generating a clock signal, comprising:
generating a digital phase error signal corresponding to a phase delay between a reference clock and a feedback signal;
filtering the phase error signal;
generating a delay control word corresponding to the phase error signal;
periodically sampling the delay control word;
controlling first and second delays in an oscillator responsive to first and successive samples of the delay control word, respectively, the oscillator presenting the clock signal at an output; and
generating the feedback signal from the clock signal;
wherein the generating step generates the delay control word at a first frequency;
and wherein the sampling step samples the delay control word at a frequency substantially twice the frequency of the first frequency.

11. The method of claim 10, wherein the controlling step comprises:
controlling the switching speed of a first delay cell in the oscillator according to a first sample of the delay control word; and
controlling the switching speed of a second delay cell in the oscillator according to a next sample of the delay control word.

12. The method of claim 11, wherein the step of controlling the switching speed of the first delay cell comprises switching selected parallel transistors in first and second bias legs of the first delay cell responsive to the first sample of the delay control word; and
wherein the step of controlling the switching speed of the second delay cell comprises switching selected parallel transistors in first and second bias legs of the first delay cell responsive to the first sample of the delay control word.

13. The method of claim 11, wherein the delay control word comprises a coarse delay control value and a fine delay control value;
wherein the step of controlling the switching speed of the first delay cell comprises switching selected parallel transistors in a first coarse bias leg and a second coarse bias leg of the first delay cell responsive to the coarse delay control value in the first sample of the delay control word;
and wherein the step of controlling the switching speed of the first delay cell comprises switching selected parallel transistors in a first fine bias leg and a second fine bias leg of the first delay cell responsive to the fine delay control value in the first sample of the delay control word.

14. A digital audio amplifier system, comprising:
a digital audio processor, for receiving an input audio signal and applying digital signal processing functions to the input audio signal, and for generating a pulse-code-modulated signal;
a pulse-code-modulation to pulse-width-modulation converter, for generating a pulse-width-modulated signal responsive to the pulse-code-modulated signal and responsive to a pulse-width-modulation clock;

a digital phase-locked loop, comprising:
phase measurement circuitry, for generating a digital phase error signal corresponding to a phase delay between a reference clock and a feedback signal;
a loop filter, having an input coupled to the phase measurement circuitry;
a digitally controlled oscillator, comprising:
digital control logic, having an input coupled to the loop filter, for generating a delay control word;
a sampling circuit, for sampling the delay control word; the sampling circuit including a first latch, having an input coupled to the digital control logic, having an output, and having a clock input; and a second latch, having an input coupled to the output of the first latch, having an output, and having a clock input;
an oscillator comprised of first and second delays that are controllable responsive to successive samples of the delay control word, and having an output presenting the pulse-width-modulation clock; and
a feedback circuit, having an input coupled to the oscillator, for generating the feedback signal to the phase measurement circuitry, and having an output coupled to the clock inputs of the first and second latches of the sampling circuit;
wherein the digital control logic generates values of the digital control word at a first frequency;
and wherein the feedback circuit clocks the first and second latches at substantially twice the first frequency.

15. The system of claim 14, wherein the oscillator comprises:
first and second delay cells in sequence, the first delay cell having a control input coupled to the output of the first latch, and the second delay cell having a control input coupled to the output of the second latch.

16. The system of claim 15, wherein the first delay cell comprises:
a first inverter, having an input and an output;
a first bias leg, comprising:
a first transistor, having a conduction path coupled between a power supply voltage and a bias terminal of the first inverter; and
a first transistor bank, comprising a plurality of transistors that each have a conductive path coupled in series with the conduction path of the first transistor, and in parallel with the conduction paths of the others of the plurality of transistors in the first transistor bank, and each having a control electrode coupled to the output of the first latch; and
a second bias leg, comprising:
a second transistor, having a conduction path coupled between a reference potential and a reference terminal of the first inverter;
a second transistor bank, comprising a plurality of transistors that each have a conductive path coupled in series with the conduction path of the second transistor, and in parallel with the conduction paths of the others of the plurality of transistors in the second transistor bank, and each having a control electrode coupled to the output of the first latch.

17. The system of claim 16, wherein the first bias leg further comprises:
a first fine transistor, having a conduction path coupled between a power supply voltage and a bias terminal of the first inverter; and
a first fine transistor bank, comprising a plurality of transistors that each have a conductive path coupled in series with the conduction path of the first transistor, and in parallel with the conduction paths of the others of the plurality of transistors in the first fine transistor bank, and each having a control electrode coupled to the output of the first latch;

and wherein the second bias leg further comprises:

a second fine transistor, having a conduction path coupled between a reference potential and a reference terminal of the first inverter; and a second fine transistor bank, comprising a plurality of transistors that each have a conductive path coupled in series with the conduction path of the first transistor, and in parallel with the conduction paths of the others of the plurality of transistors in the first fine transistor bank, and each having a control electrode coupled to the output of the first latch.

18. The system of claim 16, wherein the second delay cell comprises:

a first inverter, having an input and an output;

a first bias leg, comprising:

- a first transistor, having a conduction path coupled between a power supply voltage and a bias terminal of the first inverter; and
- a first transistor bank, comprising a plurality of transistors that each have a conductive path coupled in series with the conduction path of the first transistor, and in parallel with the conduction paths of the others of the plurality of transistors in the first transistor bank, and each having a control electrode coupled to the output of the second latch; and a second bias leg, comprising:

- a second transistor, having a conduction path coupled between a reference potential and a reference terminal of the first inverter; and
- a second transistor bank, comprising a plurality of transistors that each have a conductive path coupled in series with the conduction path of the second transistor, and in parallel with the conduction paths of the others of the plurality of transistors in the second transistor bank, and each having a control electrode coupled to the output of the second latch.

19. The system of claim 16, wherein the first delay cell further comprises:

a second inverter, having an input and an output, having a bias terminal coupled to the first bias leg, and having a reference terminal coupled to the second bias leg; and a pair of latching inverters, coupled between the output of the first inverter and the output of the second inverter.

20. The system of claim 14, wherein the loop filter comprises a first order digital filter.

21. The digital phase-locked loop of claim 4, wherein the first and second transistor bank transistors are connected, configured and adapted to be driven by respective individual bits of thermometer-encoded coarse digital control words from the first latch, and the third and fourth transistor bank transistors are connected to be driven by respective individual bits of thermometer-encoded fine digital control words from the first latch.

22. The system of claim 14, further comprising:

a power stage, for driving a speaker responsive to the pulse-width-modulated signal.

* * * * *